(12) United States Patent
Song et al.

(10) Patent No.: US 10,811,483 B2
(45) Date of Patent: Oct. 20, 2020

(54) DISPLAY DEVICE INCLUDING A BENDING PORTION AND CONDUCTIVE LINES

(71) Applicant: Samsung Display Co., Ltd., Yongin-si, Gyeonggi-do (KR)

(72) Inventors: Hagyeong Song, Cheonan-si (KR); Hyeondo Park, Gwangmyeong-si (KR); Donghyun Lee, Suwon-si (KR); Hyunyoung Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 94 days.

(21) Appl. No.: 16/168,669

(22) Filed: Oct. 23, 2018

(65) Prior Publication Data

US 2019/0123126 A1  Apr. 25, 2019

(30) Foreign Application Priority Data

Oct. 24, 2017  (KR) ........................ 10-2017-0138585

(51) Int. Cl.
| | |
|---|---|
| *H01L 27/32* | (2006.01) |
| *H01L 51/00* | (2006.01) |
| *G09G 3/3291* | (2016.01) |
| *G09G 3/3266* | (2016.01) |
| *G09G 3/3233* | (2016.01) |

(52) U.S. Cl.
CPC ....... *H01L 27/3276* (2013.01); *G09G 3/3266* (2013.01); *H01L 27/3258* (2013.01); *H01L 51/0097* (2013.01); *G09G 3/3233* (2013.01); *G09G 3/3291* (2013.01); *G09G 2300/0426* (2013.01); *G09G 2300/0819* (2013.01); *G09G 2300/0842* (2013.01); *G09G 2300/0861* (2013.01); *G09G 2310/08* (2013.01)

(58) Field of Classification Search
CPC ....... H01L 27/32; H01L 51/00; G09G 3/3291; G09G 3/3266
See application file for complete search history.

(56) References Cited

U.S. PATENT DOCUMENTS 9,117,911 B2    8/2015  Antonenkov

FOREIGN PATENT DOCUMENTS

| EP | 2 360 661 B1 | 1/2014 |
|---|---|---|
| JP | 3265702 B2 | 3/2002 |
| KR | 10-0621533 B1 | 9/2006 |
| KR | 10-2015-0005327 A | 1/2015 |

*Primary Examiner* — Joseph L Williams
(74) *Attorney, Agent, or Firm* — Lewis Roca Rothgerber Christie LLP

(57) ABSTRACT

A display device includes: a substrate having a first area, a second area, and a bending portion between the first area and the second area; a first conductive line extending to the first area, the bending portion, and the second area along a first direction on a plane; and a second conductive line including a first contact portion and a first connection portion, the first contact portion being connected to the first conductive line at the first area and the first connection portion overlapping the first conductive line on a plane and extending along the first direction to the first area, the bending portion, and the second area, wherein the second conductive line further includes a corrosion retardation portion extending from the first contact portion.

29 Claims, 18 Drawing Sheets
(2 of 18 Drawing Sheet(s) Filed in Color)

DISPLAY DEVICE INCLUDING A BENDING PORTION AND CONDUCTIVE LINES

CROSS-REFERENCE TO RELATED APPLICATION

This application claims priority to and the benefit of Korean Patent Application No. 10-2017-0138585, filed on Oct. 24, 2017, in the Korean Intellectual Property Office (KIPO), the disclosure of which is incorporated by reference herein in its entirety.

FIELD

Some example embodiments of the present invention relate to a display device.

DISCUSSION OF RELATED ART

Organic light emitting diode ("OLED") display devices are self-light emitting display devices that display images using an OLED that emits light. OLED display devices are currently garnering attention by virtue of their characteristics such as relatively low power consumption, high luminance, high reaction speed, or the like.

Recently, there is an increasing demand for OLED display devices having a large area and a high resolution and having excellent display quality. Accordingly, studies are being conducted on display devices for substantially preventing or reducing deterioration of display quality. In addition, studies are being conducted to reduce a bezel area such that a large screen can be displayed on the display device.

It is to be understood that this background of the technology section is intended to provide useful background for understanding the technology and as such disclosed herein, the technology background section may include ideas, concepts or recognitions that does not constitute prior art.

SUMMARY

Aspects of some example embodiments of the present invention may include a display device including a narrow bezel and having excellent display quality by substantially preventing or reducing deterioration of display quality caused by wiring corrosion.

According to some example embodiments, a display device includes: a substrate having a first area, a second area, and a bending portion between the first area and the second area; a first conductive line extending to the first area, the bending portion and the second area along a first direction on a plane; and a second conductive line including a first contact portion and a first connection portion, the first contact portion being connected to the first conductive line at the first area and the first connection portion overlapping the first conductive line on a plane and extending along the first direction to the first area, the bending portion and the second area. The second conductive line further includes a corrosion retardation portion extending from the first contact portion.

The corrosion retardation portion may have an area at least twice as large as an area of the first contact portion of the second conductive line.

The corrosion retardation portion may extend along the first direction.

The corrosion retardation portion may have a length of about 150 μm or more in the first direction.

The corrosion retardation portion may extend along a second direction which crosses the first direction.

The display device may further include a pixel at the first area of the substrate. The pixel may be connected to a data line at the first area, and at least one of the first conductive line and the second conductive line may be disposed on a layer substantially the same as a layer on which the data line is disposed.

The data line may include a lower line and an upper line overlapping the lower line, the lower line may be disposed on a layer substantially the same as a layer on which the first conductive line is disposed, and the upper line may be disposed on a layer substantially the same as a layer on which the second conductive line is disposed.

The second conductive line may include a second contact portion connected to the first conductive line at the second area.

The display device may further include: a pixel at the first area of the substrate; a data driver and a scan driver configured to supply a signal to the pixel; a power supply portion configured to supply a voltage to the pixel; and a fanout wiring connected to at least one of the data driver, the scan driver and the power supply portion.

The fanout wiring may be formed unitarily with the first conductive line.

The fanout wiring may be connected to the first conductive line at the second area.

The display device may further include a third conductive line extending along the first direction at the first area. The first conductive line may include a third contact portion contacting the third conductive line at the first area.

The corrosion retardation portion may have an area at least twice as large as an area of the first contact portion of the second conductive line.

The corrosion retardation portion may extend along the first direction.

The corrosion retardation portion may have a length of about 150 μm or more in the first direction.

The corrosion retardation portion may extend along a second direction which crosses the first direction.

The display device may further include a pixel at the first area of the substrate. The pixel may be connected to a gate line at the first area, and the third conductive line may be disposed on a layer substantially the same as a layer on which the gate line is disposed.

The display device may further include: a pixel at the first area of the substrate; a data driver and a scan driver configured to supply a signal to the pixel; a power supply portion configured to supply a voltage to the pixel; and a fanout wiring connected to at least one of the data driver, the scan driver and the power supply portion.

The fanout wiring may be formed unitarily with the first conductive line.

The fanout wiring may be connected to the first conductive line at the second area.

The fanout wiring may be connected to the scan driver.

The display device may further include a first insulating layer between the first conductive line and the second conductive line, the first insulating layer having a first contact hole and a second contact hole.

The display device may further include a second insulating layer between the third conductive line and the first conductive line, the second insulating layer having a third contact hole and a fanout contact hole.

The second insulating layer may not be disposed at the bending portion.

According to some example embodiments, a display device includes; a substrate having a first area, a second area and a bending portion between the first area and the second area; a first conductive line extending to the first area, the bending portion and the second area along a first direction on a plane; a second conductive line including a first contact portion and a first connection portion, the first contact portion being connected to the first conductive line at the first area and the first connection portion overlapping the first conductive line on a plane and extending along the first direction to the first area, the bending portion and the second area; and a third conductive line extending along the first direction at the first area. The first conductive line includes a third contact portion connected to the third conductive line at the first area, the second conductive line further includes a corrosion retardation portion extending from the first contact portion, and the corrosion retardation portion overlaps the third contact portion.

The corrosion retardation portion may have an area at least twice as large as an area of the first contact portion of the second conductive line.

The corrosion retardation portion may extend along the first direction.

The corrosion retardation portion may have a length of about 150 μm or more in the first direction.

The corrosion retardation portion may extend along a second direction which crosses the first direction.

The foregoing is illustrative only and is not intended to be in any way limiting. In addition to the illustrative aspects, example embodiments and features described above, further aspects, example embodiments and features will become apparent by reference to the drawings and the following detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

A more complete appreciation of aspects of the present invention will become more apparent by describing in more detail example embodiments thereof with reference to the accompanying drawings, wherein.

DETAILED DESCRIPTION

Figure 1:
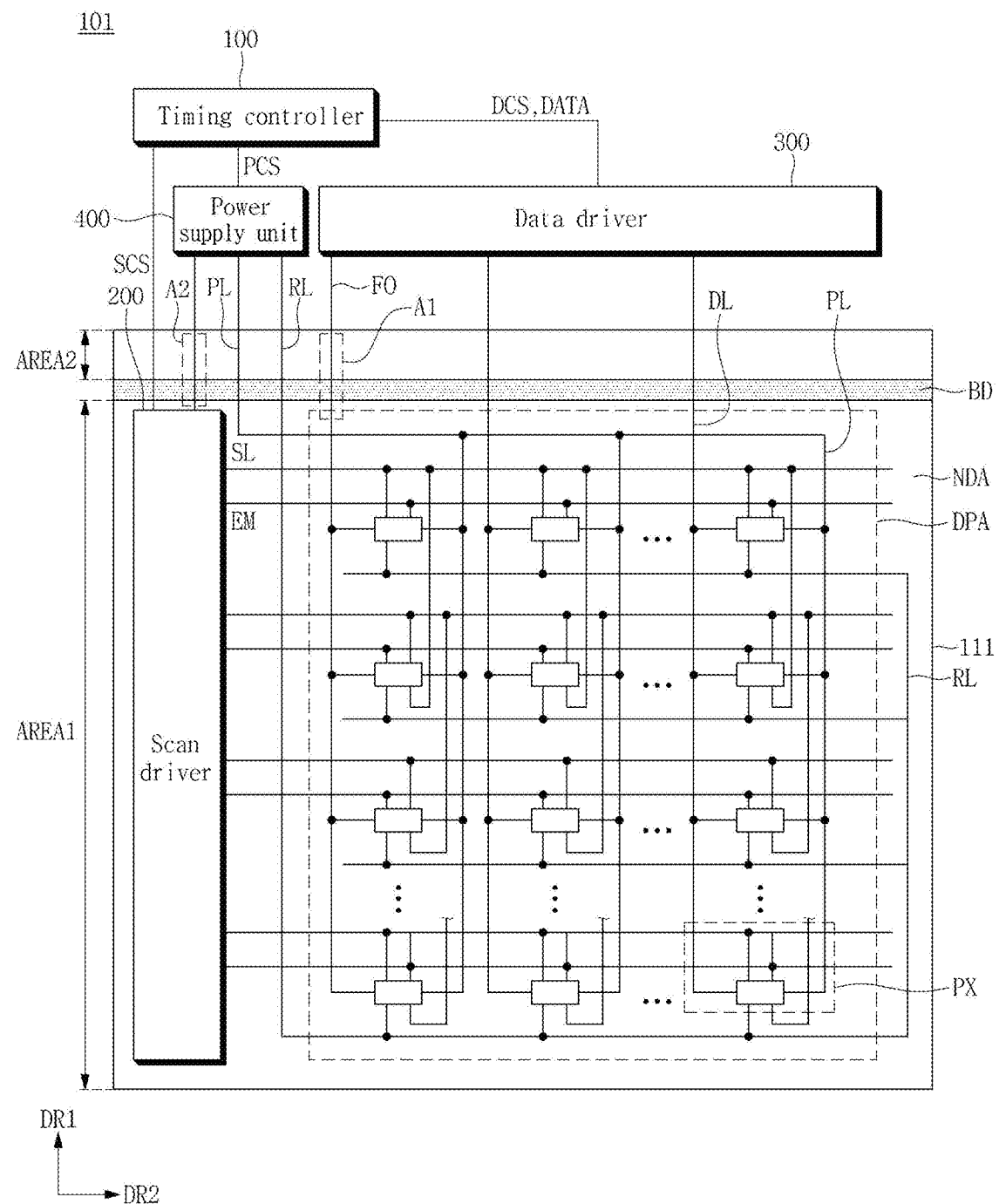
FIG. 1 is a block diagram illustrating a display device according to some example embodiments.

Some example embodiments of the present invention relate to a display device. For example, some example embodiments include a display device capable of substantially preventing or reducing deterioration of display quality due to wiring corrosion.

Aspects of some exemplary embodiments will now be described more fully hereinafter with reference to the accompanying drawings. Although the invention may be modified in various manners and have several example embodiments, example embodiments are illustrated in the accompanying drawings and will be mainly described in the specification. However, the scope of the invention is not limited to the example embodiments and should be construed as including all the changes, equivalents, and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of variation for the particular value as determined by one of ordinary skill in the art, considering the measurement in question and the error associated with measurement of the particular quantity (i.e., the limitations of the measurement system). For example, "about" may mean within one or more standard variations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present invention and like reference numerals refer to like elements throughout the specification.

Hereinafter, aspects of a display device according to some example embodiments will be described in detail with reference to FIGS. 1 to 5. The display device according to some example embodiments is an OLED display device.

For example, FIG. 1 is a block diagram illustrating a display device according to some example embodiments. As illustrated in FIG. 1, a display device includes a timing controller 100, a scan driver 200, a data driver 300, a power support portion 400, a display area DPA and a non-display area NDA.

The timing controller 100 receives input image signals and generates image data. In addition, the timing controller 100 outputs image data and various control signals DCS, SCS and PCS to the scan driver 200, the data driver 300, the power support portion 400 and the display area DPA.

Figure 6A:
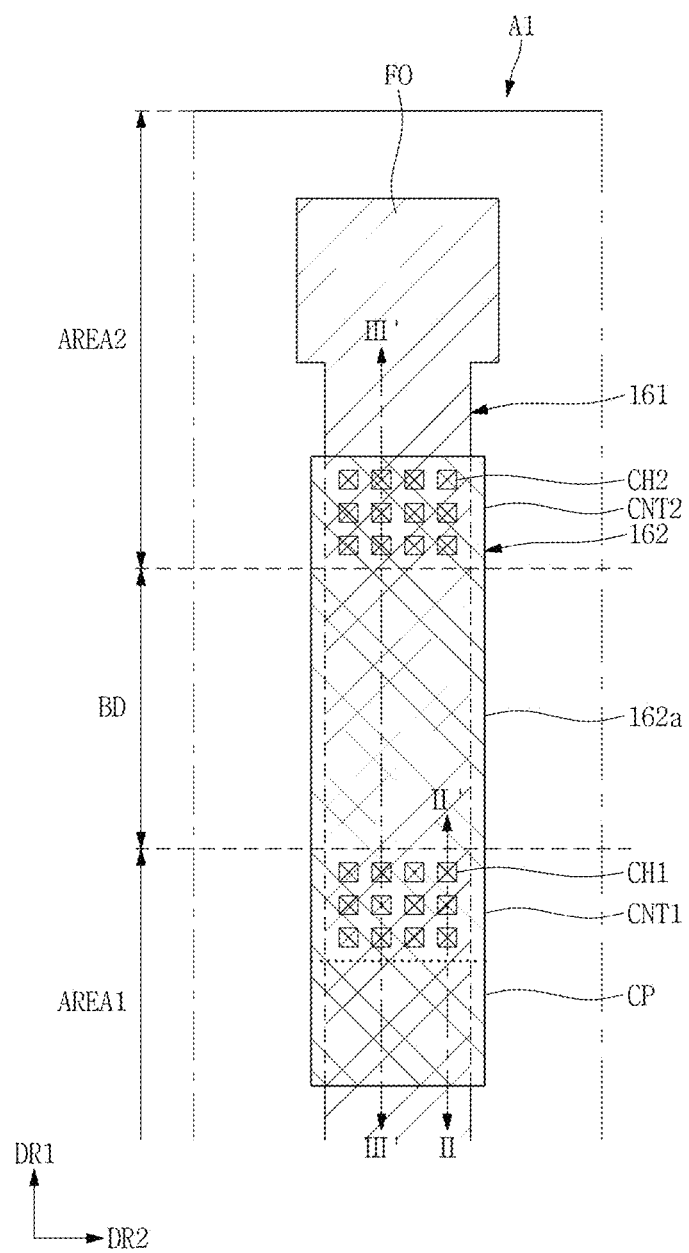
FIG. 6A is a plan view illustrating a portion A1 of FIG. 1.

The scan driver 200 receives a scan control signal SCS from the timing controller 100 through a fanout wiring FO and signal wirings 161 and 162 (see FIG. 6A). The scan control signal SCS may include a vertical start signal for starting an operation of the scan driver 200, a clock signal for determining an output timing of the signals, and the like. The scan driver 200 generates a plurality of scan signals and sequentially outputs the plurality of scan signals to a plurality of gate lines SL to be described below. In addition, the scan driver 200 generates a plurality of emission control signals in response to the scan control signal SCS and outputs the plurality of emission control signals to a plurality of emission control lines EM to be described below.

It is illustrated in FIG. 1 that the plurality of scan signals and the plurality of emission control signals are output from a single scan driver 200, but example embodiments are not limited thereto. In some example embodiments, a plurality of scan drivers may divide a plurality of scan signals to output them and divide and may divide a plurality of emission control signals to output them. In addition, in some example embodiments, a driver for generating and outputting the plurality of scan signals and a driver for generating and outputting the plurality of emission control signals may be separated.

The data driver 300 receives a data control signal DCS and image data DATA from the timing controller 100. The data driver 300 converts the image data DATA into data signals and outputs the data signals to a plurality of data lines DL to be described below. The data signal is an analog voltage corresponding to a gray level value of the image data.

The power supply portion 400 supplies a first voltage ELVDD and an initialization voltage Vint through a common power line PL and an initialization line RL connected to a pixel PX. In addition, the power supply portion 400 receives a power control signal PCS from the timing controller 100. The power supply portion 400 may supply a driving voltage to the scan driver 200 according to the power control signal PCS. Specifically, the power supply portion 400 may receive the power control signal PCS from the timing controller 100 and supply a first driving voltage which is a positive voltage higher than the first voltage ELVDD and a second driving voltage which is a negative voltage lower than a second voltage ELVSS to the scan driver 200 through the fanout wiring FO and the signal lines 161 and 162 (see FIG. 6A).

The display area DPA includes the plurality of gate lines SL, the plurality of emission control lines EM, the plurality of data lines DL and the plurality of pixels PX arranged on a substrate 111. The plurality of gate lines SL are arranged in a first direction DR1 and extend in a second direction DR2 which crosses the first direction DR1. Each of the plurality of emission control lines EM may be arranged in parallel to each corresponding one of the plurality of gate lines SL. The plurality of data lines DL are insulated from and intersect the plurality of gate lines SL.

The pixel PX is connected to the gate line SL, the emission control line EM and the data line DL. The pixel PX receives the first voltage ELVDD and the second voltage ELVSS having a level lower than a level of the first voltage ELVDD (see FIG. 3). The pixel PX includes the common power line PL applying the first voltage ELVDD and the initialization line RL receiving the initialization voltage Vint. The first voltage ELVDD is also referred to as a common voltage.

One pixel PX may be electrically connected to two gate lines. As illustrated in FIG. 1, pixels PX connected to a second gate line (hereinafter, pixels of the second pixel row) may be also connected to a first gate line. Accordingly, the pixels PX of the second pixel row receive a scan signal applied to the second gate line and a scan signal applied to the first gate line.

The pixel PX includes an OLED and a circuit portion controlling light emission of the OLED. The circuit portion may include a plurality of thin film transistors and a plurality of capacitors. The display area DPA may include a red pixel emitting a red light, a green pixel emitting a green light and a blue pixel emitting a blue light. An OLED of the red pixel, an OLED of the green pixel and an OLED of the blue pixel may respectively include organic light emitting layers each including different materials.

The plurality of gate lines SL, the plurality of emission control lines EM, the plurality of data lines DL, the common power line PL, the initialization line RL and the plurality of pixels PX may be formed through a plurality of patterning processes. In addition, a plurality of insulating layers may be formed on the substrate 111 through a plurality of deposition or coating processes. Each insulating layer may include at least one of an organic layer and an inorganic layer.

Figure 2:
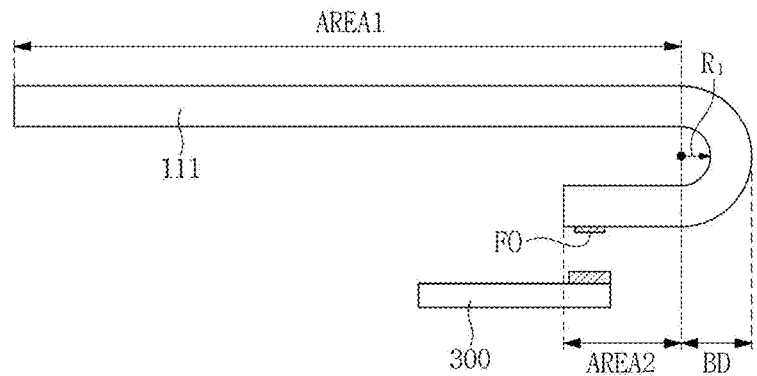
FIG. 2 is a cross-sectional view illustrating a substrate in a bended state according to some example embodiments.

FIG. 2 is a cross-sectional view illustrating the substrate 111 in a bended state.

The substrate 111 includes a first area AREA1, a second area AREA2 and a bending portion BD between the first area AREA1 and the second area AREA2. Referring to FIGS. 1 and 2, the first area AREA1 and the second area AREA2 may be divided from each other by the bending portion BD.

The display area DPA is located at the first area AREA1 of the substrate 111. The display area DPA includes the plurality of pixels PX and images are displayed thereon. The second area AREA2 and the bending portion BD are located at the non-display area NDA where no image is displayed.

The substrate 111 has flexible characteristics and is capable of being bended 180 degrees (°) as illustrated in FIG. 2. The substrate 111, for example, may include a plastic film.

The second area AREA2 includes the fanout wiring FO and various driving means may be connected to the signal wirings 161 and 162 (see FIG. 6A) arranged on the substrate 111 through the fanout wiring FO. For example, the data driver 300 may be connected to the fanout wiring FO arranged at the second area AREA2. However, example embodiments are not limited thereto, and at least one of the timing controller 100, the scan driver 200, the data driver 300 and the power supply portion 400 may be connected to the fanout wiring FO positioned at the second area AREA2.

Referring to FIG. 2, the substrate 111 is bended at the bending portion BD so that the second area AREA2 may overlap the first area AREA1. That is, the second area AREA2 including the fanout wiring FO may be arranged on a back surface of the display area DPA. As such, a part of the substrate 111 is bended so that the fanout wiring FO is arranged on the back surface of the display area DPA and thereby a display device including a narrow bezel may be provided.

In the bended state, an inner radius of curvature R1 of the bending portion BD may be about 1,000 μm or less. For example, in the bended state, the inner radius of curvature R1 of the bending portion BD may be in a range from about 0 μm to about 500 μm. When a substrate 111 of a thin film type having excellent flexible characteristics is used, the inner radius of curvature R1 of the bending portion BD may be in a range from about 0 μm to about 50 μm in the bended state. When a transparent polymer film is used as the substrate 111, the inner radius of curvature R1 of the bending portion BD may be in a range from about 0.1 μm to about 50 μm in the bended state. However, example embodiments are not limited thereto.

Figure 3:
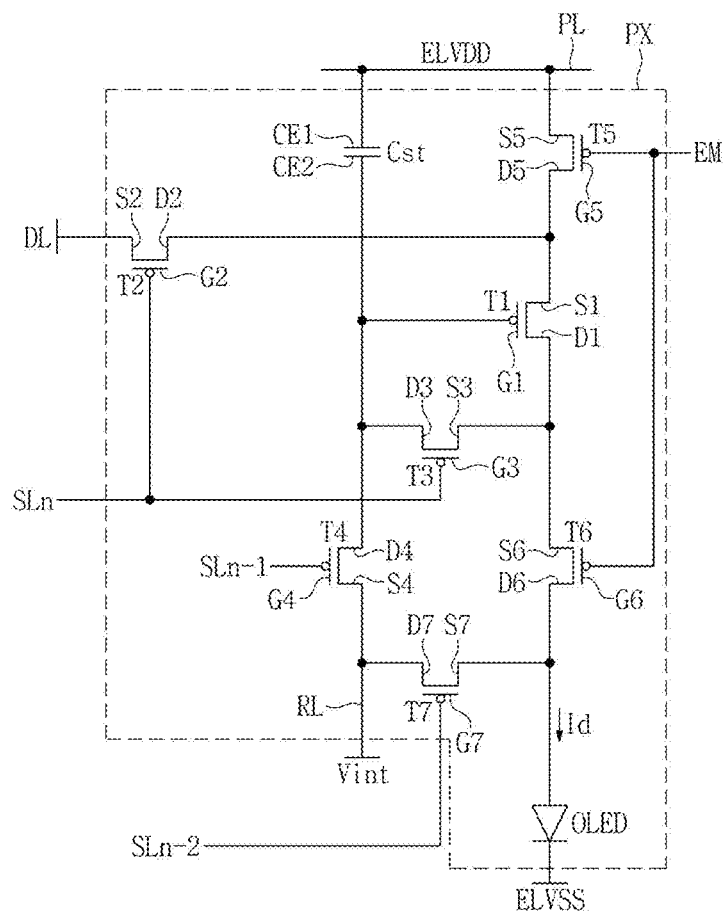
FIG. 3 is a circuit diagram illustrating a pixel of a display device according to some example embodiments.

FIG. 3 is a circuit diagram illustrating a pixel of a display device according to some example embodiments.

As illustrated in FIG. 3, one pixel PX of the display device according to some example embodiments includes a plurality of thin film transistors T1, T2, T3, T4, T5, T6 and T7, a plurality of wirings SLn, SLn-1, SLn-2, EM, Vint, DL and PL selectively connected to the plurality of thin film transistors T1, T2, T3, T4, T5, T6 and T7, a capacitor Cst and an OLED.

The plurality of thin film transistors T1, T2, T3, T4, T5, T6 and T7 include a first thin film transistor T1, a second thin film transistor T2, a third thin film transistor T3, a fourth thin film transistor T4, a fifth thin film transistor T5, a sixth thin film transistor T6 and a seventh thin film transistor T7.

A first gate electrode G1 of the first thin film transistor T1 is connected to a third drain electrode D3 of the third thin film transistor T3 and a fourth drain electrode D4 of the fourth thin film transistor T4. A first source electrode S1 of the first thin film transistor T1 is connected to a second drain electrode D2 of the second thin film transistor T2 and a fifth drain electrode D5 of the fifth thin film transistor T5. A first source electrode D1 of the first thin film transistor T1 is connected to a third source electrode S3 of the third thin film transistor T3 and a sixth source electrode S6 of the sixth thin film transistor T6.

A second gate electrode G2 of the second thin film transistor T2 is connected to a first gate line SLn, a second source electrode S2 of the second thin film transistor T2 is connected to a data line DL and the second drain electrode D2 of the second thin film transistor T2 is connected to the first source electrode S1 of the first thin film transistor T1.

A third gate electrode G3 of the third thin film transistor T3 is connected to the first gate line SLn, the third source electrode S3 of the third thin film transistor T3 is connected to the first drain electrode D1 of the first thin film transistor T1, and the third drain electrode D3 of the third thin film transistor T3 is connected to the first gate electrode G1 of the first thin film transistor T1.

A fourth gate electrode G4 of the fourth thin film transistor T4 is connected to a second gate line SLn-1, a fourth source electrode S4 of the fourth thin film transistor T4 is connected to an initialization line RL and the fourth drain electrode D4 is connected to the first gate electrode G1 of the first thin film transistor T1. An initialization voltage Vint is applied through the initialization line RL.

A fifth gate electrode G5 of the fifth thin film transistor T5 is connected to an emission control line EM, a fifth source electrode S5 of the fifth thin film transistor T5 is connected to a common power line PL, and the fifth drain electrode D5 of the fifth thin film transistor T5 is connected to the first source electrode S1 of the first thin film transistor T1.

A sixth gate electrode G6 of the sixth thin film transistor T6 is connected to the emission control line EM, and the sixth source electrode S6 of the sixth thin film transistor T6 is connected to the first drain electrode D1 of the first thin film transistor T1. A sixth drain electrode D6 of the sixth thin film transistor T6 is connected to a first electrode PE1 (see FIG. 4) of the OLED. The first electrode PE1 is a pixel electrode.

A seventh gate electrode G7 of the seventh thin film transistor T7 is connected to a third gate line SLn-2, a seventh source electrode S7 of the seventh thin film transistor T7 is connected to the OLED, and a seventh drain electrode D7 of the seventh thin film transistor T7 is connected to the fourth source electrode S4 of the fourth thin film transistor T4.

As such, signal lines for transmitting scan signals include the first gate line SLn for transmitting a first scan signal to each of the second gate electrode G2 of the second thin film transistor T2 and the third gate electrode G3 of the third thin film transistor T3, the second gate line SLn-1 for transmitting a second scan signal to the fourth gate electrode G4 of the thin film transistor T4, the third gate line SLn-2 for transmitting a third scan signal to the seventh gate electrode G7 of the thin film transistor T7, and the emission control line EM for transmitting a light emission control signal to each of the fifth gate electrode G5 of the thin film transistor T5 and the sixth gate electrodes G6 of the thin film transistor T6.

The capacitor Cst includes one electrode CE1 connected to the common power line PL and another electrode CE2 connected to the first gate electrode G1 of the first thin film transistor T1 and the third drain electrode D3 of the third thin film transistor T3.

Figure 5:
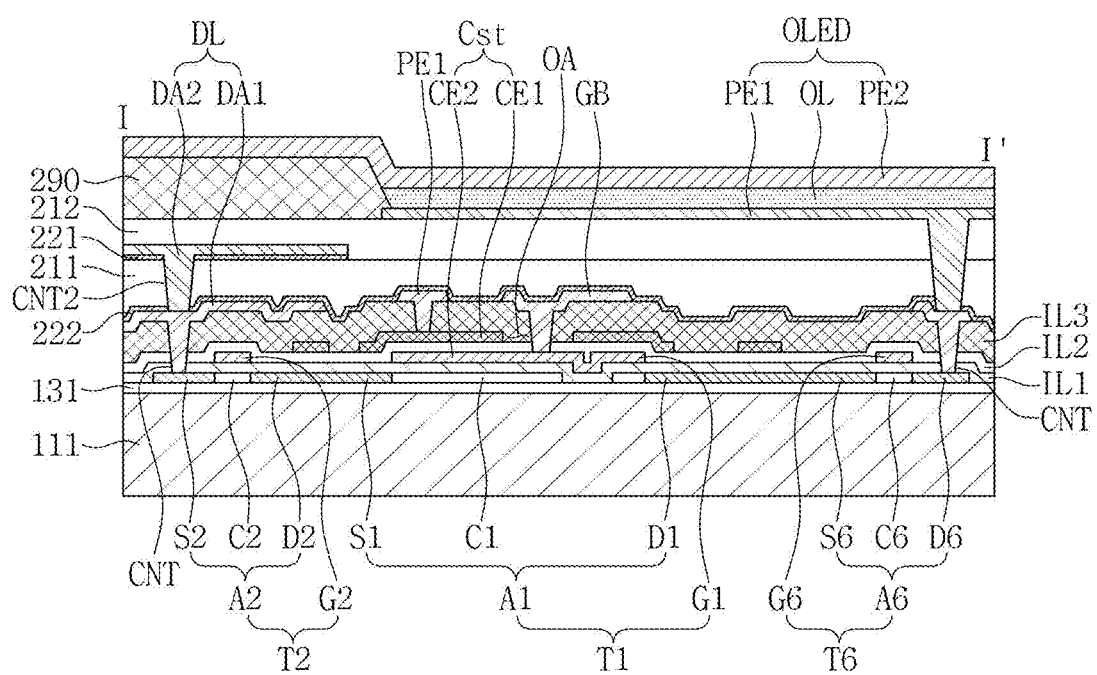
FIG. 5 is a cross-sectional view taken along the line I-I' of FIG. 4.

The OLED includes the first electrode PE1, a second electrode PE2 on the first electrode PE1 and an organic light emitting layer OL between the first electrode PE1 and the second electrode PE2 (see FIG. 5). The first electrode PE1 of the OLED is connected to each of the seventh source electrode S7 of the seventh thin film transistor T7 and the sixth drain electrode D6 of the sixth thin film transistor T6. The second voltage ELVSS is applied through the second electrode PE2.

Figure 4:
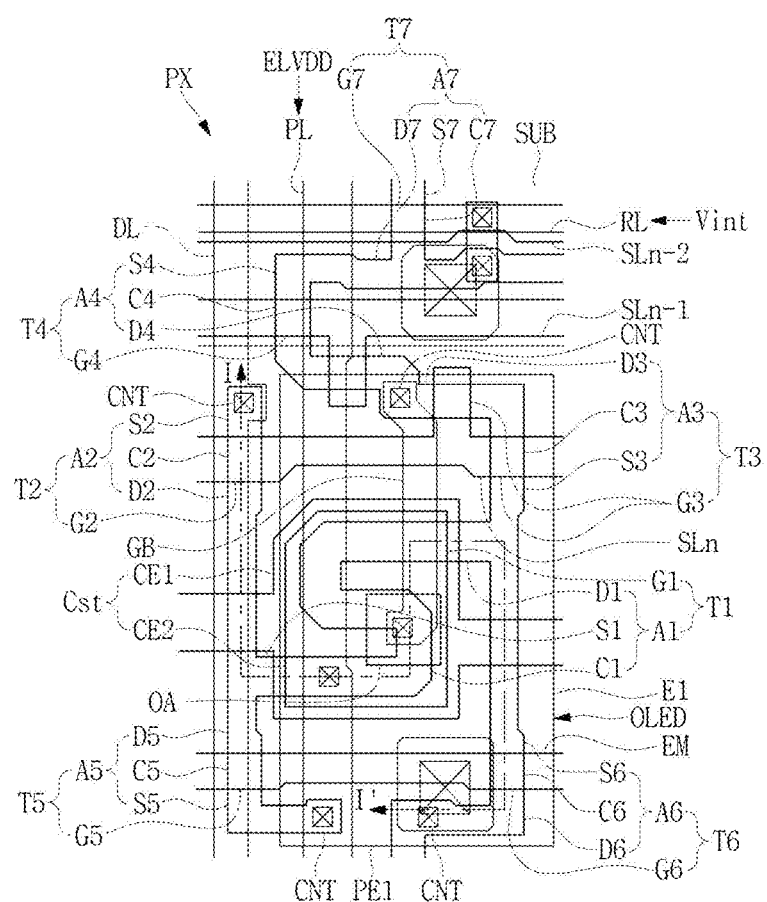
FIG. 4 is a plan view illustrating a pixel of a display device according to some example embodiments.

FIG. 4 is a plan view illustrating a pixel of a display device according to some example embodiments, and FIG. 5 is a cross-sectional view taken along the line I-I' of FIG. 4.

As illustrated in FIGS. 4 and 5, the pixel PX arranged at the substrate 111 includes a first thin film transistor T1, a second thin film transistor T2, a third thin film transistor T3, a fourth thin film transistor T3, a fifth thin film transistor T5, a sixth thin film transistor T6, a seventh thin film transistor T7, a first gate line SLn, a second gate line SLn-1, a third gate line SLn-2, an emission control line EM, a capacitor Cst, a data line DL, a common power line PL, a gate bridge GB, an initialization line RL, and an OLED.

The first, second, third, fourth, fifth, sixth and seventh thin film transistors T1, T2, T3, T4, T5, T6 and T7 are arranged on the substrate 111 and respectively include first, second, third, fourth, fifth, sixth and seventh active layers A1, A2, A3, A4, A5, a6 and a7 and first, second, third, fourth, fifth, sixth and seventh gate electrodes G1, G2, G3, G4, G5, G6 and G7.

Respective ones of the first, second, third, fourth, fifth, sixth and seventh active layers A1, A2, A3, A4, A5, a6 and a7 include first, second, third, fourth, fifth, sixth and seventh source electrodes S1, S2, S3, S4, S5, S6 and S7, first, second, third, fourth, fifth, sixth and seventh channels C1, C2, C3, C4, C5, C6 and C7, first, second, third, fourth, fifth, sixth and seventh drain electrodes D1, D2, D3, D4, D5, D6 and D7. The first, second, third, fourth, fifth, sixth and seventh active layers A1, A2, A3, A4, A5, A6 and A7 may include polysilicon or an oxide semiconductor. The oxide semiconductor may include at least one selected from: oxides based on titanium (Ti), hafnium (Hf), zirconium (Zr), aluminum (Al), tantalum (Ta), germanium (Ge), zinc (Zn), gallium (Ga), tin (SLn) or indium (In), and/or composite oxides thereof such as zinc oxide (ZnO), indium-gallium-zinc oxide (InGaZnO$_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O) and hafnium-indium-zinc oxide (Hf—In—Zn—O). When the first active layer A1 includes the oxide semiconductor, a separate protective layer may be additionally provided to protect the oxide semiconductor from an external environment, e.g., a high temperature.

The first, second, third, fourth, fifth, sixth and seventh active layers A1, A2, A3, A4, A5, A6 and A7 may include a substantially same material and may be unitarily formed to be connected to each other.

Each of the first, second, third, fourth, fifth, sixth and seventh channels C1, C2, C3, C4, C5, C6 and C7 of the first, second, third, fourth, fifth, sixth and seventh active layers A1, A2, A3, A4, A5, A6 and A7 may be channel-doped with an N-type impurity or a P-type impurity. In addition, the first, second, third, fourth, fifth, sixth and seventh source electrodes S1, S2, S3, S4, S5, S6 and S7 and the first, second, third, fourth, fifth, sixth and seventh drain electrodes D1, D2, D3, D4, D5, D6 and D7 are respectively spaced apart from each other with the first, second, third, fourth, fifth, sixth and seventh channels C1, C2, C3, C4, C5, C6 and C7 therebetween, respectively, and each are doped with a doping impurity having a type opposite to a type of a doping impurity doped to the first, second, third, fourth, fifth, sixth and seventh channels C1, C2, C3, C4, C5, C6 and C7.

The first, second, third, fourth, fifth, sixth and seventh gate electrodes G1, G2, G3, G4, G5, G6 and G7, the first, second, third, fourth, fifth, sixth and seventh source electrodes S1, S2, S3, S4, S5, S6 and S7 and the first, second, third, fourth, fifth, sixth and seventh drain electrodes D1, D2, D3, D4, D5, D6 and D7 may be connected to each other, respectively, by a contact hole, a gate bridge GB, or the like, and may be connected to the first, second and third gate lines SLn, SLn-1 and SLn-2, the emission control line EM, the capacitor Cst, the data line DL, the common power line PL, the initialization line RL and the OLED.

The first, second, third, fourth, fifth, sixth and seventh gate electrodes G1, G2, G3, G4, G5, G6 and G7 may be located on the first, second, third, fourth, fifth, sixth and seventh channels C1, C2, C3, C4, C5, C6 and C7 of the first, second, third, fourth, fifth, sixth and seventh active layers A1, A2, A3, A4, A5, A6 and A7, respectively.

A first insulating layer IL1, a second insulating layer IL2 and a third insulating layer IL3 are laminated sequentially on the first active layer A1, the second active layer A2, the third active layer A3, the fourth active layer A4, the fifth active layer A5, the sixth active layer A6, and the seventh active layer A7. Each of the first insulating layer IL1, the second insulating layer IL2 and the third insulating layer IL3 may be an organic insulating layer or an inorganic insulating layer such as silicon nitride or silicon oxide. In addition, each of the insulating layers may be formed into a single layer or multiple layers. The plurality of contact holes CNT are defined in each of the first insulating layer IL1, the second insulating layer IL2 and the third insulating layer IL3 in a selective manner. The first insulating layer IL1 contacts each of the first active layer A1, the second active layer A2, the third active layer A3, the fourth active layer A4, the fifth active layer A5, the sixth active layer A6 and the seventh active layer A7.

The first gate line SLn is located on the second active layer A2 and the third active layer A3, extends along a direction crossing the second active layer A2 and the third active layer A3, and is formed unitarily with the second gate electrode G2 and the third gate electrode G3 to be connected to the second gate electrode G2 and the third gate electrode G3.

The second gate line SLn-1 is spaced apart from the first gate line SLn, is located on the fourth active layer A4, extends along a direction crossing the fourth active layer A4, and is formed unitarily with the fourth gate electrode G4 to be connected to the fourth gate electrode G4.

The third gate line SLn-2 is spaced apart from the second gate line SLn-1, is located on the seventh active layer A7, extends along a direction crossing the seventh active layer A7, and is formed unitarily with the seventh gate electrode G7 to be connected to the seventh gate electrode G7.

The emission control line EM is spaced apart from the first gate line SLn, is located on the fifth active layer A5 and the sixth active layer A6, extends along a direction crossing the fifth active layer A5 and the sixth active layer A6, and is formed unitarily with the fifth gate electrode G5 and the sixth gate electrode G6 to be connected to the fifth gate electrode G5 and the sixth gate electrode G6.

The emission control line EM, the third gate line SLn-2, the second gate line SLn-1, the first gate line SLn, the first gate electrode G1, the second gate electrode SLn-2, the third gate electrode G3, the fourth gate electrode G4, the fifth gate electrode G5, the sixth gate electrode G6 and the seventh gate electrode G7 are located on a substantially same layer and include a substantially same material. However, example embodiments are not limited thereto, and each of the emission control line EM, the third gate line SLn-2, the second gate line SLn-1, the first gate line SLn, the first gate electrode G1, the second gate electrode SLn-2, the third gate electrode G3, the fourth gate electrode G4, the fifth gate electrode G5, the sixth gate electrode G6, and the seventh gate electrode G7 may be located on different layers and include different materials.

The capacitor Cst includes one electrode CE1 and another electrode CE2 which oppose each other with an insulating layer therebetween. Herein, the another electrode CE2 may be the first gate electrode G1. The one electrode CE1 of the capacitor is located on the first gate electrode G1 and is connected to the common power line PL through a contact hole.

The one electrode CE1 of the capacitor forms the capacitor Cst together with the first gate electrode G1. The first gate electrode G1 and the one electrode CE1 of the capacitor may include a substantially same metal or different metals on different layers.

The one electrode CE1 of the capacitor has an opening OA through which a part of the first gate electrode G1 is exposed and the gate bridge GB is connected to the first gate electrode G1 through the opening OA.

The data line DL is located on the first gate line SLn, extends along a direction crossing the first gate line SLn, and is connected to the source electrode S2 of the second active layer A2 through a contact hole CNT. The data line DL extends across the first gate line SLn, the second gate line SLn-1, the third gate line SLn-2, and the emission control line EM.

According to some example embodiments, the data line DL includes a lower line DA1 and an upper line DA2 overlapping the lower line DA1. In addition, the pixel PX includes a first inorganic layer 221, a first organic layer 211 and a second inorganic layer 222 sequentially arranged between the upper line DA2 and the lower line DA1. The lower line DA1 and the upper line DA2 contact each other through the contact hole CNT in the pixel PX. Herein, the lower line DA1 and the upper line DA2 are merely named to distinguish the two lines DA1 and DA2 and the terms of upper and lower do not limit the positions thereof.

As described above, because the data line DL has a multilayer structure, signal supply through the data lines DL may become smooth. Accordingly, the display device may have excellent luminous efficiency and a reaction speed of the OLED may be improved.

The gate bridge GB is located on the first gate line SLn, is spaced apart from the common power line PL, and is connected to each of the third drain electrode D3 of the third active layer A3 and the fourth drain electrode D4 of the fourth active layer A4 through a contact hole CNT. In addition, the gate bridge GB is connected to the first gate electrode G1.

The common power line PL is spaced apart from the data line DL, is located on the first gate line SLn, and extends along a direction crossing the first gate line SLn. That is, the common power line PL extends across the first gate line SLn, the second gate line SLn-1, the third gate line SLn-2 and the emission control line EM.

The common power line PL is connected to the OLED through at least one thin film transistor. Referring to FIG. 4, the common power line PL is connected to the one electrode CE1 of the capacitor Cst and the fifth source electrode S5 of the fifth active layer A5 connected to the first active layer A1 through a contact hole CNT.

The common power line PL may have a multilayer structure. For example, the common power line PL may have a double-layer structure. However, example embodiments are not limited thereto, and the common power line PL may have a single-layer structure or a triple or more-layer structure. As the common power line PL has a multilayer structure, current and power supply through the common power line PL may become smooth. Accordingly, a voltage drop (IR drop) may be substantially prevented and the display device may have excellent luminous efficiency and high luminance. In particular, a voltage drop (IR drop) may be substantially prevented in a large-sized display device and display quality of the large-sized display device may be improved (see FIG. 10).

In addition, according to some example embodiments, the reaction speed of the OLED may be improved, and a line width of the common power line PL may be reduced. Accordingly, a high-resolution display device may have a high luminance.

The first and second organic layers 211 and 212 are arranged on the common power line PL. The first and second organic layers 211 and 212 serve as an insulating layer and a planarization layer.

The lower line DA1 of the data line DL, the common power line PL and the gate bridge GB described above are located on a substantially same layer and include a substantially same material. However, in some example embodiments, each of the lower line DA1 of the data line DL, the common power line PL, and the gate bridge GB may be located on different layers and include different materials in a selective manner.

The initialization line RL is located on the second gate line SLn-1 and is connected to the fourth source electrode S4 of the fourth active layer A4 through a contact hole. The initialization line RL and the first electrode PEI of the OLED may be located on a substantially same layer and may include a substantially same material. However, in some example embodiments, the initialization line RL and the first electrode PE1 may be located on different layers and may include different materials from each other.

The pixel defining layer 290 has an opening, and the first electrode PE1 of the OLED is exposed from the pixel defining layer 290 through the opening. The pixel defining layer 290 may define a light emitting area of the OLED.

The OLED includes the first electrode PEI, the organic light emitting layer OL and the second electrode PE2. The first electrode PE1 is connected to the sixth drain electrode D6 of the sixth thin film transistor T6 through a contact hole CNT. The organic light emitting layer OL is positioned between the first electrode PE1 and the second electrode PE2. The second electrode PE2 is located on the organic light emitting layer OL. One of the first electrode PE1 and the second electrode PE2 may have light transmittance. A light emitted from the organic light emitting layer OL may be emitted toward one or more of the first electrode PE1 and the second electrode PE2.

Although not illustrated, a capping layer covering the OLED may be arranged on the OLED. In addition, a thin film encapsulation layer or an encapsulation substrate may be arranged on the OLED.

Hereinafter, the first area AREA1 and the bending portion BD of the substrate 111 will be described in detail with reference to FIGS. 6A to 10.

Figure 6B:
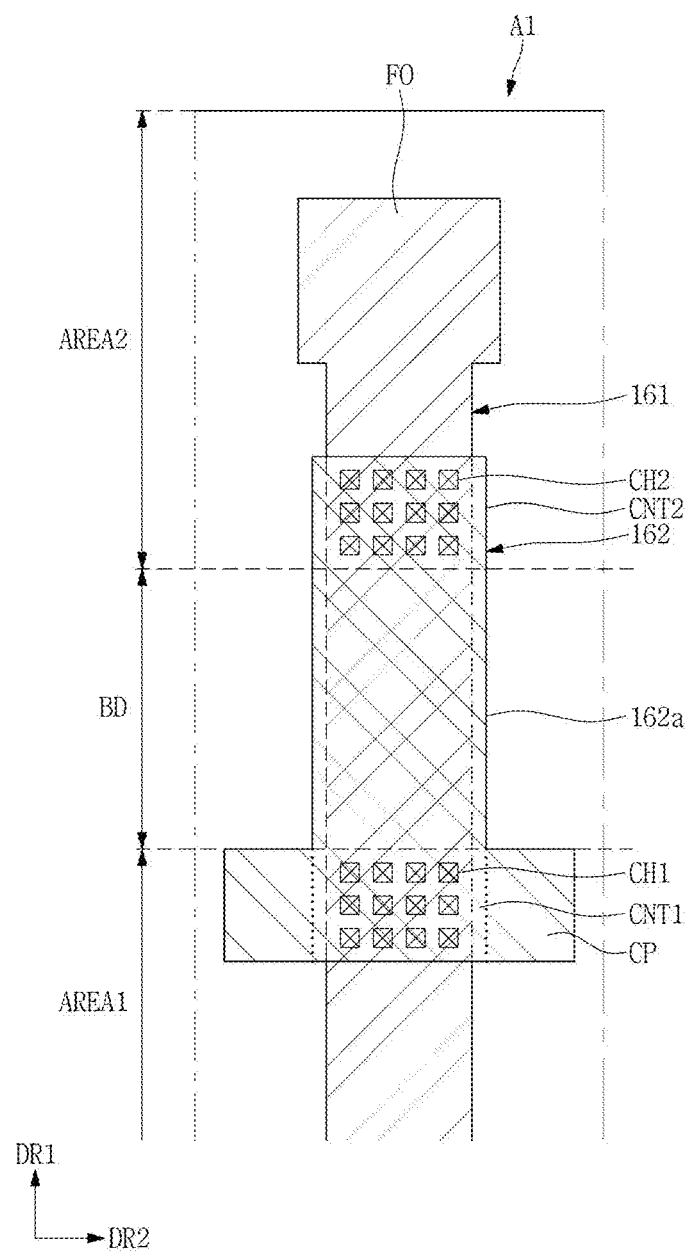
FIG. 6B is another plan view illustrating the portion A1 of FIG. 1.
Figure 6C:
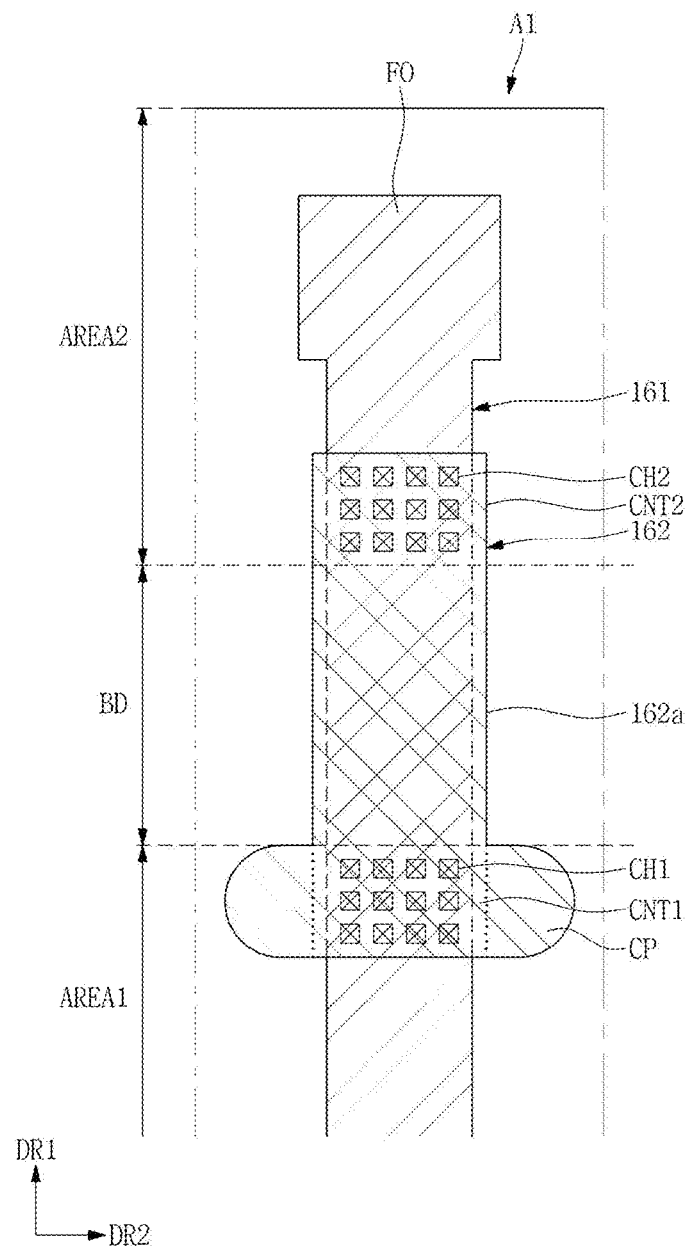
FIG. 6C is still another plan view illustrating the portion A1 of FIG. 1.
Figure 6D:
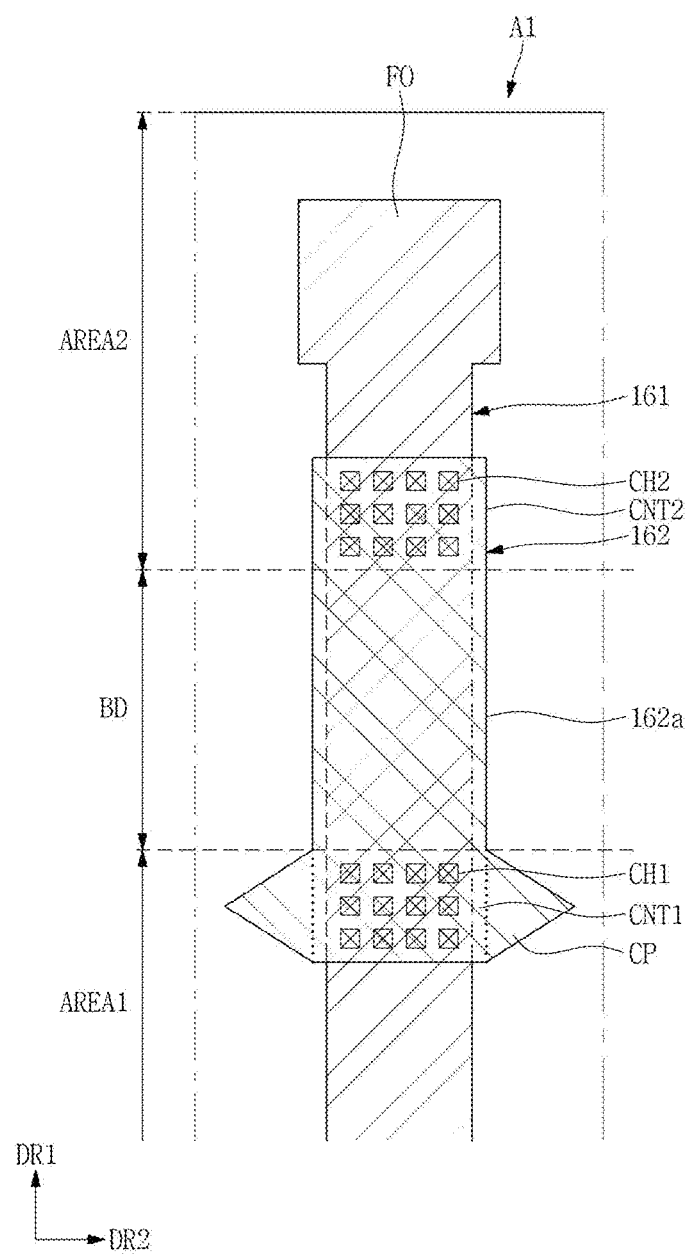
FIG. 6D is still another plan view illustrating the portion A1 of FIG. 1.

FIG. 6A is a plan view illustrating a portion A1 of FIG. 1, FIG. 6B is another plan view illustrating the portion A1 of FIG. 1, FIG. 6C is still another plan view illustrating the portion A1 of FIG. 1, and FIG. 6D is still another plan view illustrating the portion A1 of FIG. 1.

A portion of the first substrate 111 is illustrated in FIGS. 6A, 6B, 6C and 6D.

A display device according to some example embodiments includes the first conductive line 161 and the second conductive line 162 arranged on the first area AREA1, the bending portion BD and the second area AREA2 of the substrate 111. The first conductive line 161 may be connected to the fanout wiring FO at the second area AREA2 and the fanout wiring FO may be connected to at least one of the timing controller 100, the scan driver 200, the data driver 300, and the power supply portion 400.

The fanout wiring FO illustrated in FIGS. 6A, 6B, 6C and 6D may be in the form of a pad. However, example embodiments are not limited thereto and the fanout wiring FO may have a width substantially the same as a width of the first conductive line 161.

As illustrated in FIGS. 6A, 6B, 6C and 6D, the fanout wiring FO may be formed unitarily with the first conductive line 161. Alternatively, the fanout wiring FO may be connected to the first conductive line 161 through a contact hole (not illustrated) at the second area AREA2.

Hereinafter, configurations of the first conductive line 161 and the second conductive line 162 will be described in detail with reference to FIGS. 7 to 10.

Figure 7:
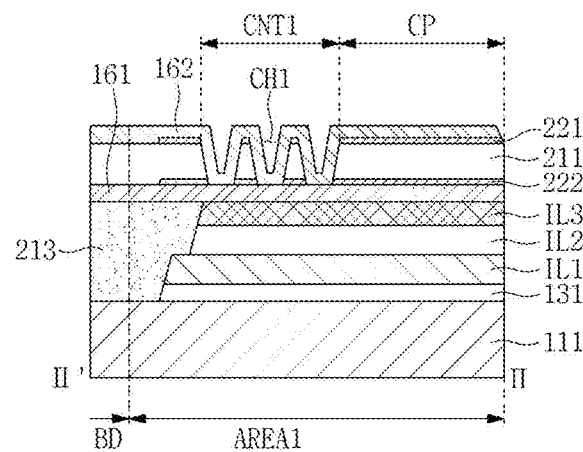
FIG. 7 is a cross-sectional view taken along the line II-II' of FIG. 6.
Figure 8:
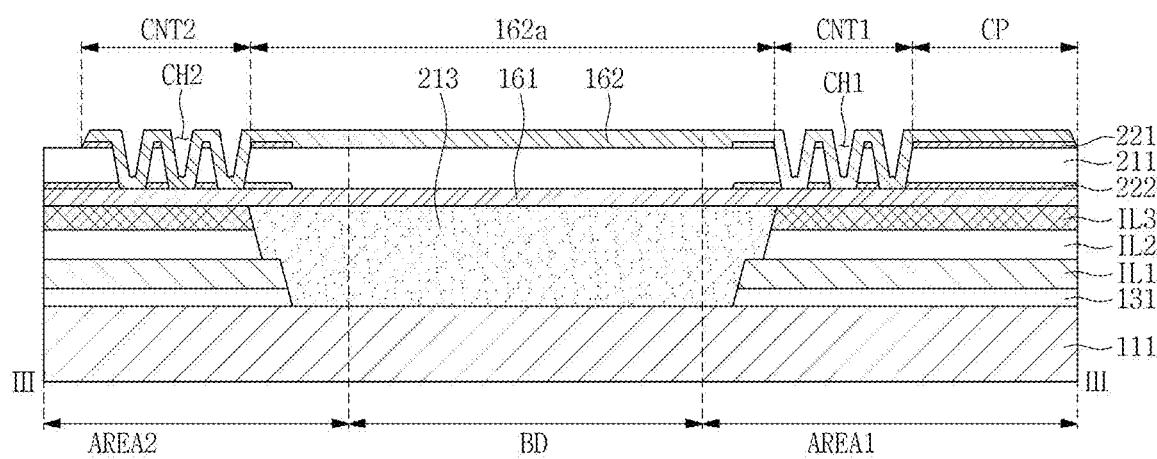
FIG. 8 is a cross-sectional view taken along the line III-III' of FIG. 6.

FIG. 7 is a cross-sectional view taken along the line II-II' of FIG. 6, and FIG. 8 is a cross-sectional view taken along the line of FIG. 6.

Referring to FIGS. 7 and 8, a display device according to some example embodiments includes the first conductive line 161 on the first area AREA1, the bending portion BD and the second area AREA2 of the substrate 111, the second inorganic layer 222 on the first conductive line 161, the first organic layer 211 on the second inorganic layer 222, and the second conductive line 162 on the first organic layer 211. The second conductive line 162 overlaps the first conductive line 161 and extends from the first area AREA1 to the second area AREA2. In some example embodiments, the first inorganic layer 221 and the second organic layer 211 have a first contact hole CH1 and a second contact hole CH2. The first conductive line 161 and the second conductive line 162 are connected to each other at the first area AREA1 and the second area AREA2 through the first contact hole CH1 and the second contact hole CH2.

In addition, a third organic layer 213 is arranged between the substrate 111 and the first conductive line 161 at the bending portion BD. The first insulating layer IL1, the second insulating layer IL2, the first inorganic layer 221 and the second inorganic layer 222 are not arranged at the bending portion BD.

Referring to FIGS. 6A, 6B, 6C, 6D and 7, the second conductive line 162 includes a first contact portion CNT1, a first connection portion 162a, a second contact portion CNT2 and a corrosion retardation portion CP.

The first contact portion CNT1 is located at the first area AREA1, and the second conductive line 162 contacts the first conductive line 161 to be connected thereto through the first contact hole CH1 at the first contact portion CNT1. However, the number of the first contact holes CH1 is not limited.

The first contact portion CNT1 may have a width substantially the same as a width of the first connection portion 162a to be described below.

The first connection portion 162a overlaps the first conductive line 161 on a plane and extends along the first direction DR1 to the first area AREA1, the bending portion BD and the second area AREA2. For example, the first connection portion 162a is positioned between the first contact portion CNT1 and the second contact portion CNT2 on a plane, and extends to the first area AREA1, the bending portion BD and the second area AREA2 from the first contact portion CNT1 toward the second contact portion CNT2.

The first connection portion 162a may have a straight line shape. However, example embodiments are not limited thereto, and the first connection portion 162a may have various shapes such as a trapezoidal shape and a shape including a hole in order to prevent display failure due to damage of the first connection portion 162a located at the bending portion BD.

The second contact portion CNT2 is located at the second area AREA2, and the second conductive line 162 is connected to the first conductive line 161 through the second contact hole CH2 at the second contact portion CNT2. However, the number of the second contact holes CH2 is not limited.

Because the first conductive line 161 and the second conductive line 162 are connected to each other at the bending portion BD through the first contact hole CH1 and the second contact hole CH2, even if either the first conductive line 161 or the second conductive line 162 is disconnected at the bending portion BD, a power or signal may be transmitted. Accordingly, defects of the display device may be reduced.

The second conductive line 162 may be corroded by an electric field formed in the periphery and moisture permeated from the outside. In particular, the corrosion may be started from an edge of the second conductive line 162 and proceed toward the first contact portion CNT1 along the first direction DR1 and the second direction DR2. When the corrosion reaches the first contact portion CNT1, a contact resistance of the first contact hole CH1 at the first contact portion CNT1 increases and the signal and voltage are not transmitted. Accordingly, display failure may occur.

The corrosion retardation portion CP extends from the first contact portion CNT1, and may increase the time it takes for the corrosion started from the edge of the second conductive line 162 to reach the first contact portion CNT1. Accordingly, the time it takes for display failure to occur may be delayed.

The corrosion retardation portion CP may have an area at least twice as large as an area of the first contact portion CNT1. In specific, as illustrated in FIG. 6A, the corrosion retardation portion CP may extend from the first contact portion CNT1 along the first direction DR1. The corrosion retardation portion CP may have a length of about 150 μm or more from the first contact portion CNT1. In addition, as illustrated in FIGS. 6B, 6C and 6D, the corrosion retardation portion CP may extend from the first contact portion CNT1 along the second direction DR2. For example, the corrosion retardation portion CP may be in the form of quadrangles (see FIG. 6B), hemispheres (see FIG. 6C) and triangles (see FIG. 6D) each spaced apart from each other with the first contact portion CNT1 therebetween. However, the shape of the corrosion retardation portion CP is not limited thereto and the corrosion retardation portion CP may extend from the first contact portion CNT1 in the first direction DR1 or the second direction DR2.

Figure 9:
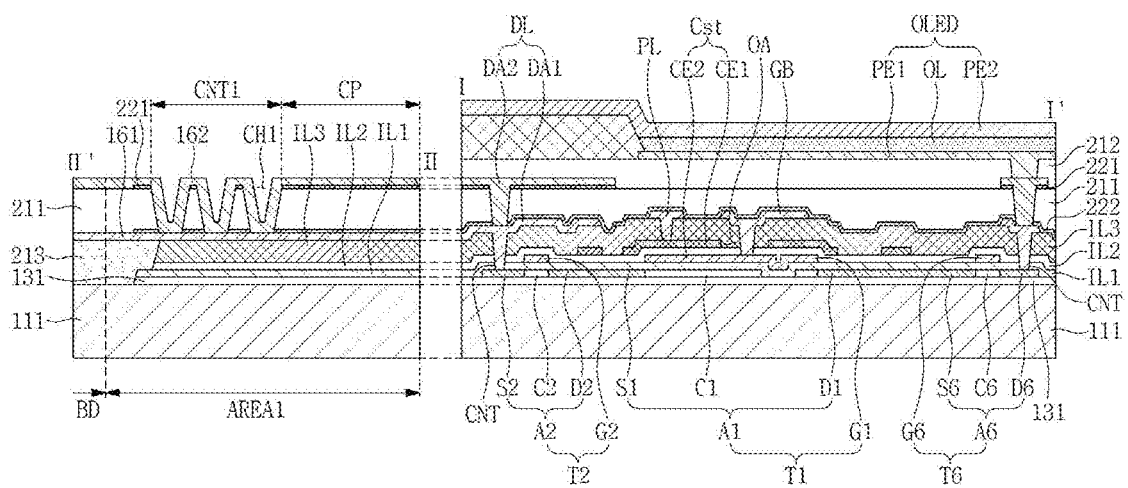
FIG. 9 illustrates the cross-sectional view taken along the line II-II' of FIG. 6 and the cross-sectional view taken along the line I-I' of FIG. 4 for comparison.
Figure 10:
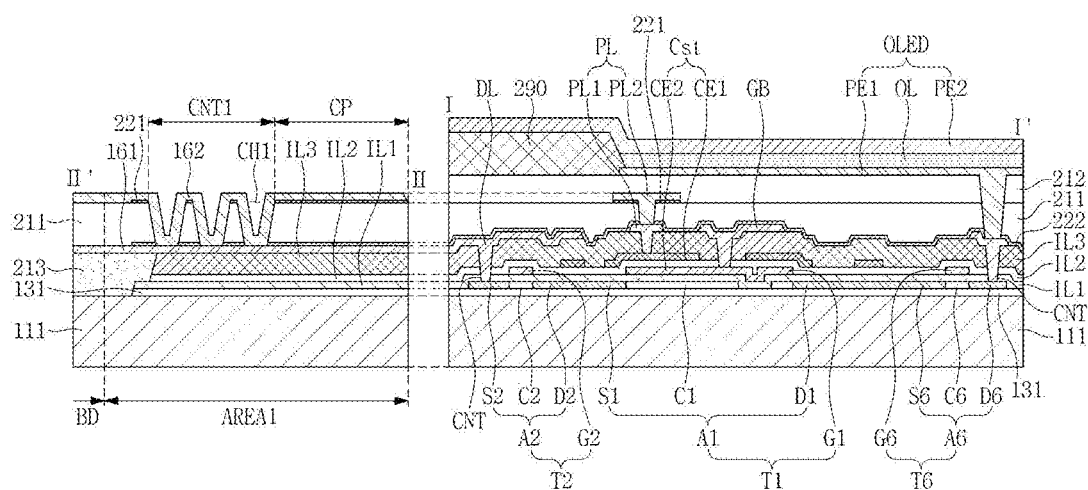
FIG. 10 illustrates a cross-sectional view taken along the line II-II' of FIG. 6 according to some example embodiments and the cross-sectional view taken along the line I-I' of FIG. 4 for comparison.

FIG. 9 illustrates the cross-sectional view taken along the line II-II' of FIG. 6 and the cross-sectional view taken along the line I-I' of FIG. 4 for comparison, and FIG. 10 illustrates a cross-sectional view taken along the line II-II' of FIG. 6 according to another example embodiment and the cross-sectional view taken along the line I-I' of FIG. 4 for comparison.

At least one of the first conductive line 161 and the second conductive line 162 may be arranged on a layer substantially the same as a layer on which the common power line PL and the data line DL are arranged and may include a material substantially the same as a material included in the common power line PL and the data line DL. In addition, at least one of the first conductive line 161 and the second conductive line 162 may be formed unitarily with the common power line PL or the data line DL, and accordingly, at least one of the first conductive line 161 and the second conductive line 162 may be connected to the common power line PL or the data line DL.

Referring to FIG. 9, the first conductive line 161 may be arranged on a layer substantially the same as a layer on which the common power line PL and the lower line DA1 of the data line DL are arranged and may include a material substantially the same as a material included in the common power line PL and the lower line DA1 of the data line DL. In addition, the first conductive line 161 may be formed unitarily with the common power line PL and the lower line DA1 of the data line DL, and accordingly, the first conductive line 161 may be connected to the common power line PL or the lower line DA1 of the data line DL. The second conductive line 162 may be arranged on a layer substantially the same as a layer on which the upper line DA2 of the data line DL is arranged and may include a material substantially the same as a material included in the upper line DA2 of the data line DL. In addition, the second conductive line 162 may be formed unitarily with the upper line DA2 of the data line DL, and accordingly, the second conductive line 162 may be connected to the upper line DA2 of the data line DL.

Referring to FIG. 10, the first conductive line 161 may be arranged on a layer substantially the same as a layer on which a first power line PL1 of the common power line PL and the data line DL are arranged and may include a material substantially the same as a material included in the first power line PL1 of the common power line PL and the data line DL. In addition, the first conductive line 161 may be formed unitarily with the first power line PL1 of the common power line PL and the data line DL, and accordingly, the first conductive line 161 may be connected to the first power line PL1 of the common power line PL and the data line DL. The second conductive line 162 may be arranged on a layer substantially the same as a layer on which a second power line PL2 of the common power line PL is arranged and may include a material substantially the same as a material included in the second power line PL2 of the common power line PL. In addition, the second conductive line 162 may be formed unitarily with the second power line PL2 of the common power line PL, and accordingly, the second conductive line 162 may be connected to the second power line PL2 of the common power line PL.

Hereinafter, a first conductive line and a second conductive line according to still another example embodiment will be described in more detail with reference to FIGS. 11A to 16.

Figure 11A:
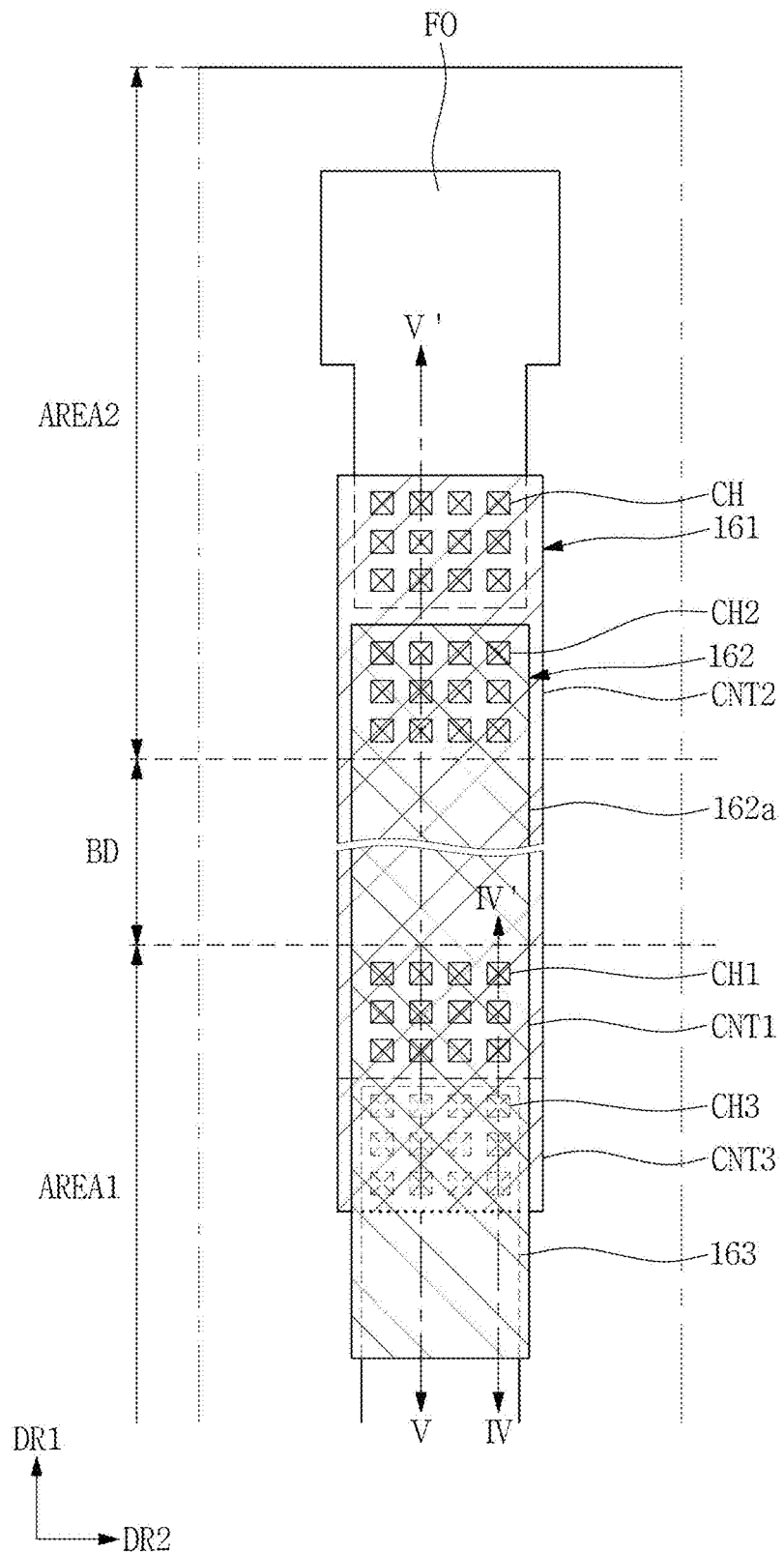
FIG. 11A is a plan view illustrating a portion A2 of FIG. 1.
Figure 11B:
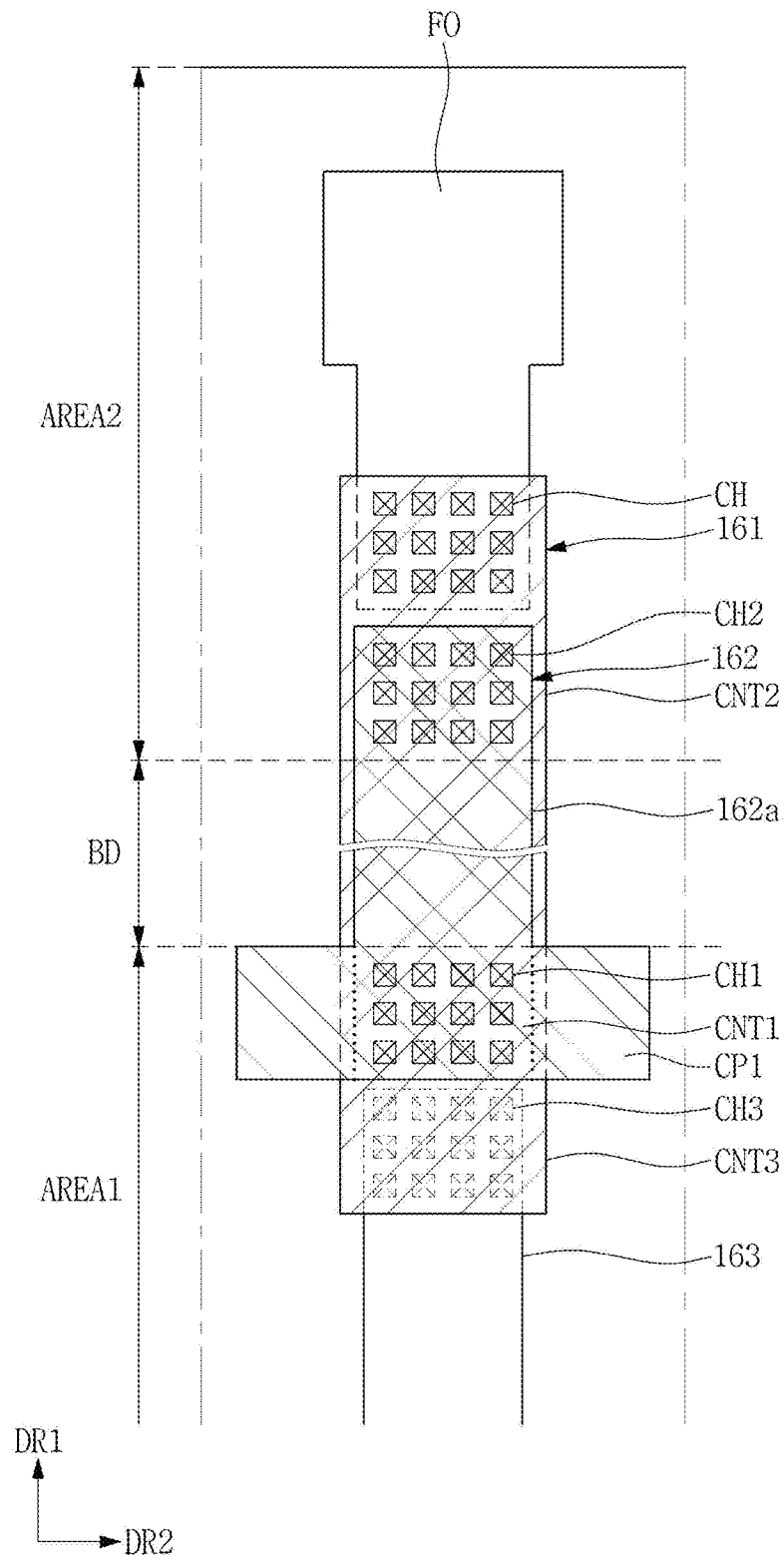
FIG. 11B is another plan view illustrating the portion A2 of FIG. 1.
Figure 11C:
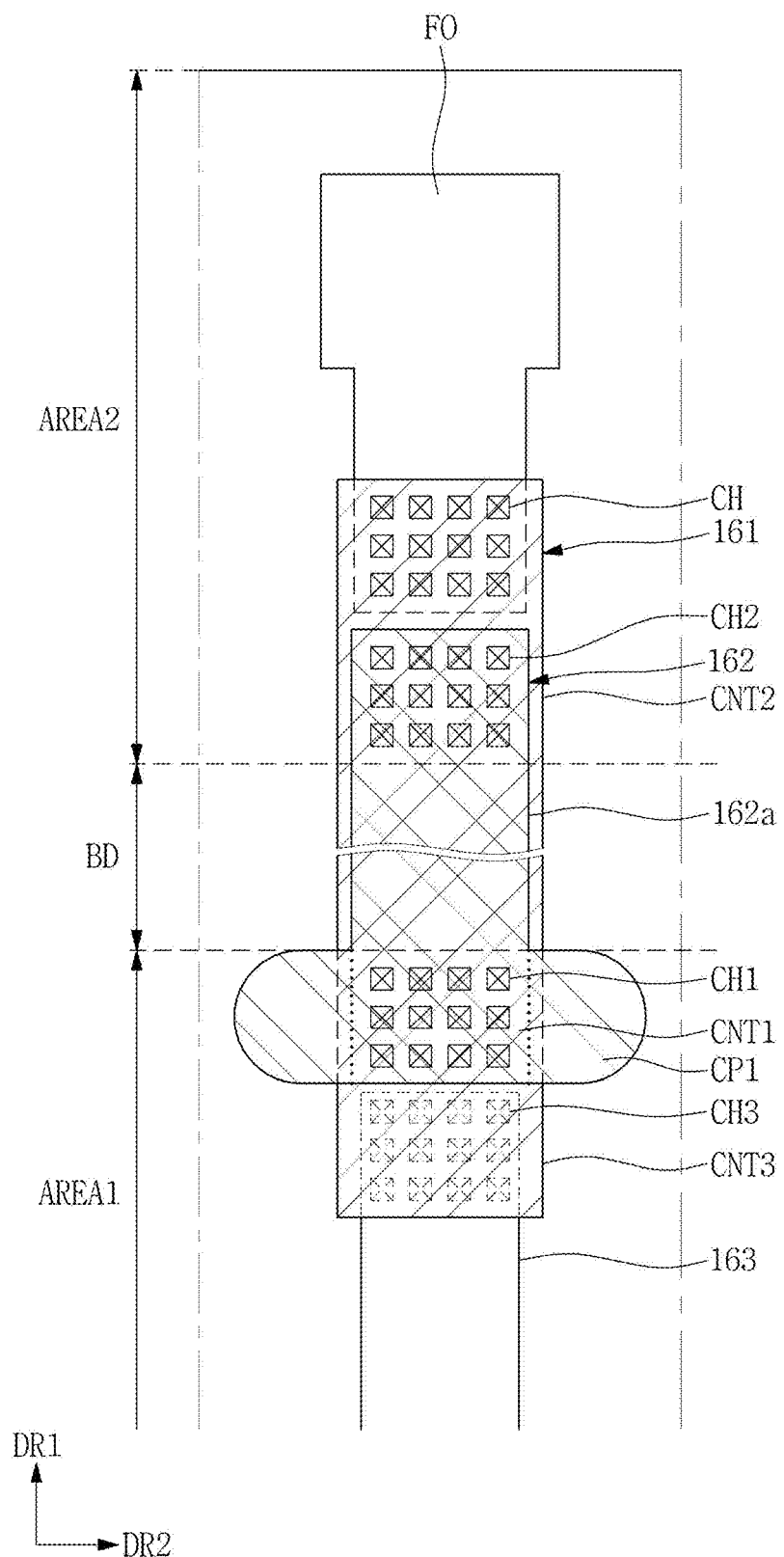
FIG. 11C is still another plan view illustrating the portion A2 of FIG. 1.
Figure 11D:
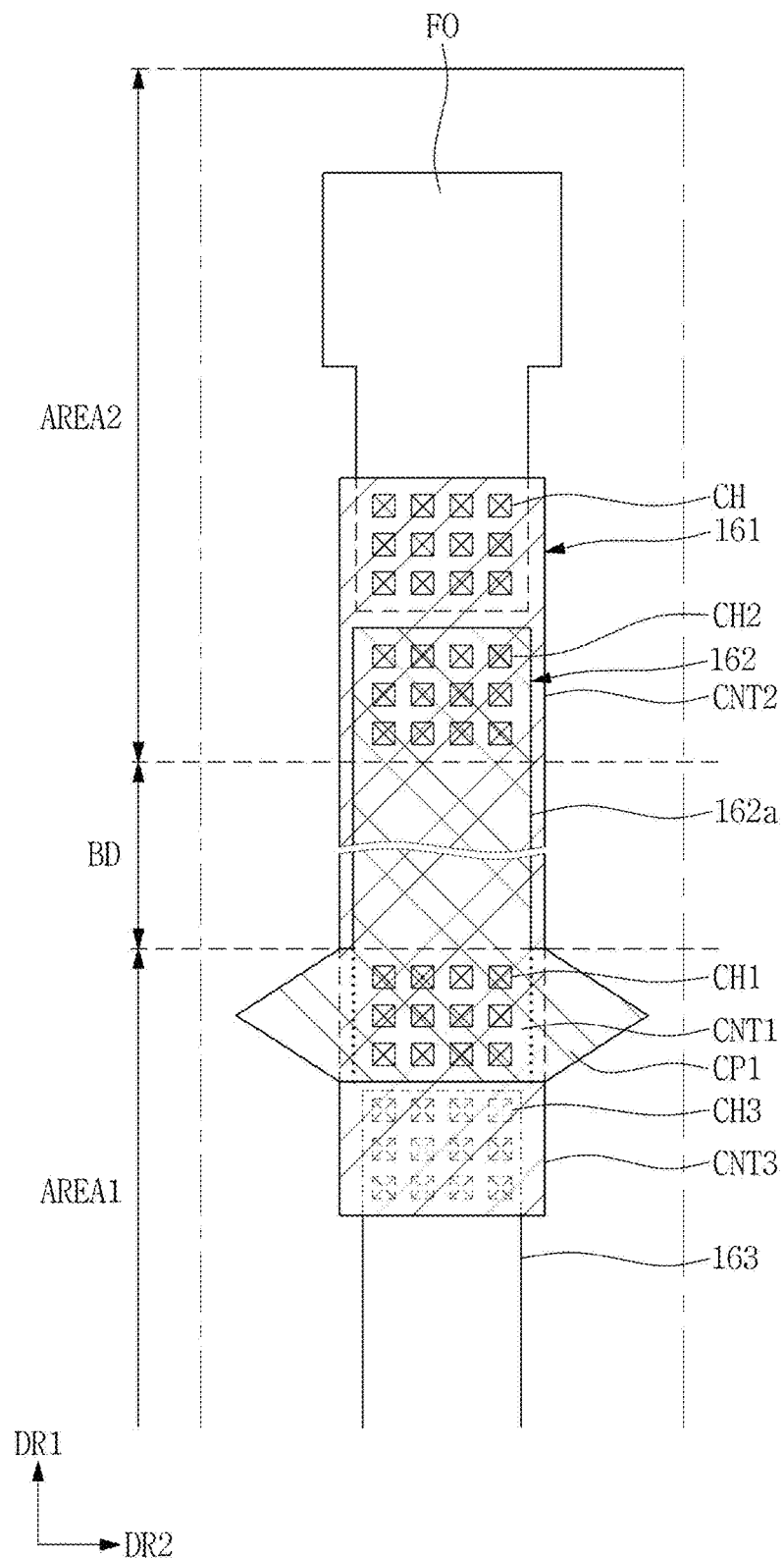
FIG. 11D is still another plan view illustrating the portion A2 of FIG. 1.
Figure 12:
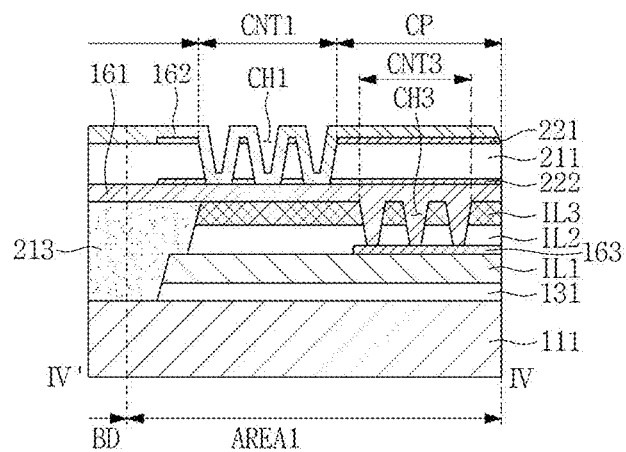
FIG. 12 is a cross-sectional view taken along the line IV-IV' of FIG. 11A.

FIG. 11A is a plan view illustrating a portion A2 of FIG. 1, FIG. 11B is another plan view illustrating the portion A2 of FIG. 1, FIG. 11C is still another plan view illustrating the portion A2 of FIG. 1, and FIG. 11D is still another plan view illustrating the portion A2 of FIG. 1. FIG. 12 is a cross-sectional view taken along the line IV-IV' of FIG. 11A, and FIG. 13 is a cross-sectional view taken along the line V-V' of FIG. 11A.

Referring to FIGS. 11A, 11B, 11C and 11D, a fanout wiring FO may be connected to a first conductive line 161 through a fanout contact hole CH at a second area AREA2. However, example embodiments are not limited thereto, and the fanout wiring FO may be formed unitarily with the first conductive line 161.

Figure 13:
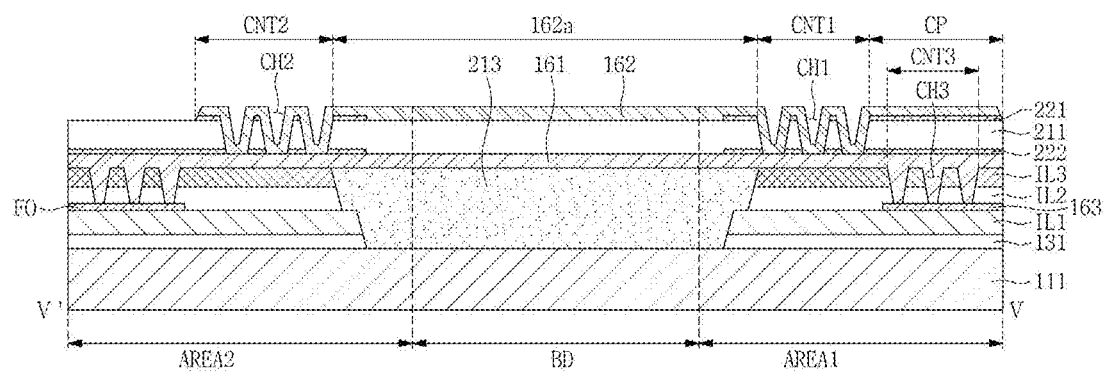
FIG. 13 is a cross-sectional view taken along the line V-V' of FIG. 11A.

Referring to FIGS. 12 and 13, a display device according to some example embodiments includes: a third conductive line 163 at a first area AREA1 of a substrate 111; the fanout wiring FO at the second area AREA2 of the substrate 111; a second insulating layer IL2 and a third insulating layer IL3 on the third conductive line 163; the first conductive line 161 on the first area AREA1, a bending portion BD and the second area AREA2 of the substrate 111; a second inorganic layer 222 on the first conductive line 161; a first organic layer 211 on the second inorganic layer 222; a first inorganic layer 221 on the first organic layer 211; and a second conductive line 162 on the first organic layer 211. The second conductive line 162 overlaps the first conductive line 161 and extends from the first area AREA1 to the second area AREA2. In some example embodiments, the first inorganic layer 221, the second inorganic layer 222, and the first organic layer 211 have a first contact hole CH1 and a second contact hole CH2, and the first conductive line 161 and the second conductive line 162 are connected to each other through the first contact hole CH1 and the second contact hole CH2 at the first area AREA1 and the second area AREA2. In addition, the second insulating layer IL2 and the third insulating layer IL3 have a third contact hole CH3 and a fanout contact hole CH, and each of the second insulating layer IL2 and the third insulating layer IL3 is connected to the third conductive line 163 through the third contact hole CH3 at the first area AREA1 and is connected to the fanout wiring FO through the fanout contact hole CH at the second area AREA2.

In addition, a third organic layer 213 is arranged between the substrate 111 and the first conductive line 161 at the bending portion BD. The first insulating layer IL1, the second insulating layer IL2, the first inorganic layer 221 and the second inorganic layer 222 are not arranged at the bending portion BD.

Referring to FIGS. 11A to 16, the first conductive line 161 includes a third contact portion CNT3.

The first conductive line. 161 may be arranged on the second insulating layer IL2 and the third insulating layer IL3 at the first area AREA1 and the second area AREA2 and may be arranged on the third organic layer 213 at the bending portion BD. In some example embodiments, the second insulating layer IL2 and the third insulating layer IL3 have a third contact hole CH3, and the third conductive line 163 and the first conductive line 161 are connected to each other through the third contact hole CH3.

The third contact portion CNT3 is located at the first area AREA1 and is located at one end portion of the first conductive line 161. The first conductive line 161 contacts the third conductive line 163 to be connected thereto through the third contact hole CH3 at the third contact portion CNT3. In some example embodiments, the first conductive line 161 may contact the third conductive line 163 to be connected thereto through a plurality of third contact holes CH3 at the third contact portion CNT3, as illustrated in the drawings.

According to some example embodiments, a corrosion retardation portion CP may extend in the first direction DR1 and overlap the third contact portion CNT3 on a plane, as illustrated in FIG. 11A.

Figure 14:
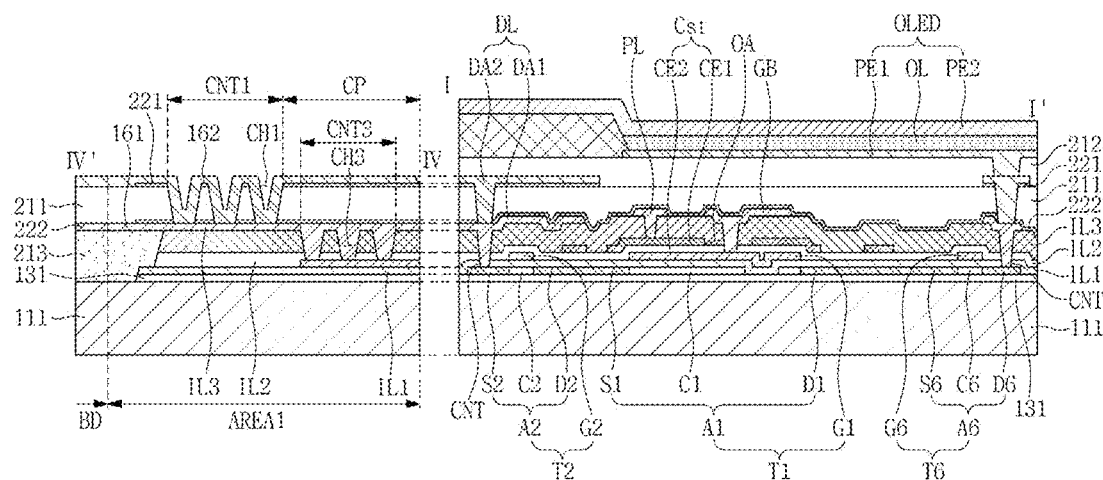
FIG. 14 illustrates the cross-sectional view taken along the line IV-IV' of FIG. 11A and the cross-sectional view taken along the line I-I' of FIG. 4 for comparison.
Figure 15A:
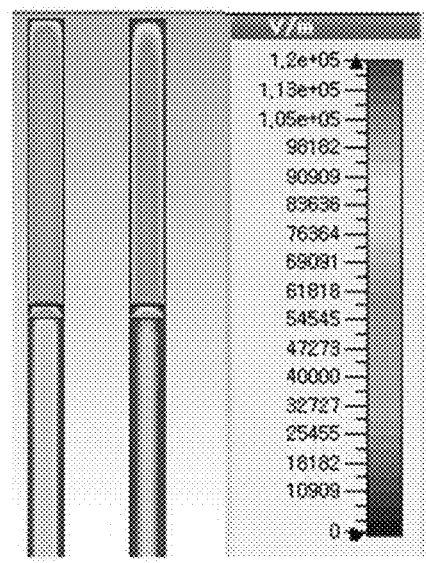
FIGS. 15A and 15B illustrate electric field formation around a second conductive line according to some example embodiments.
Figure 15B:
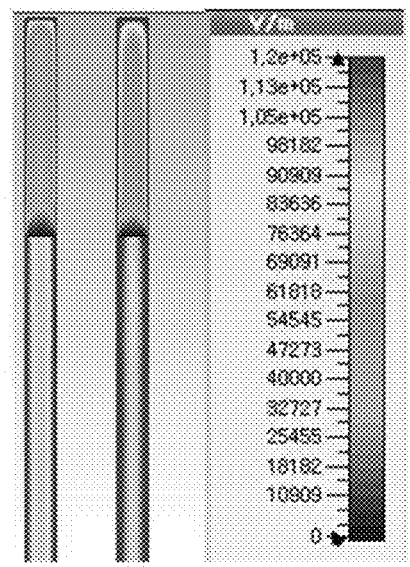
Figure 16:
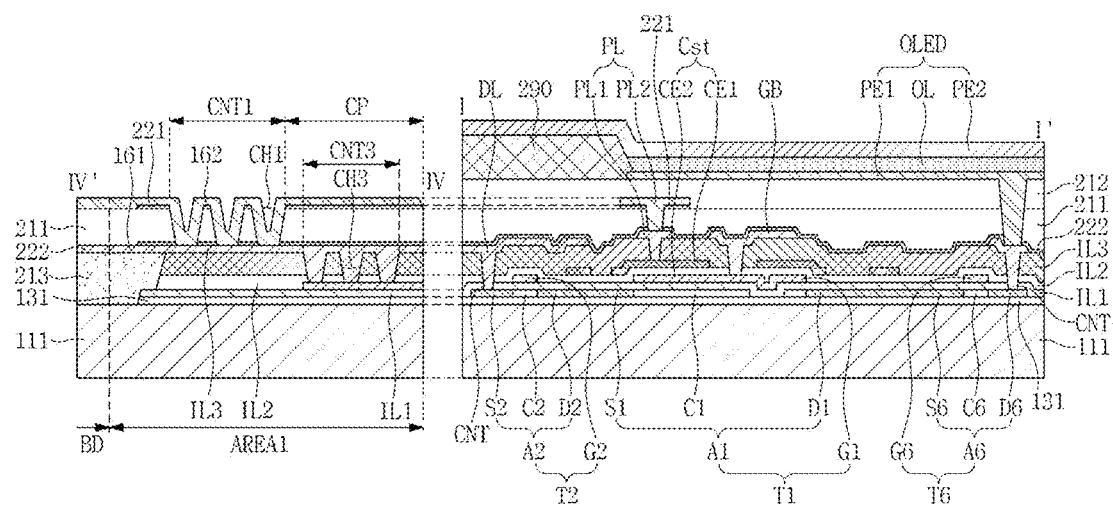
FIG. 16 illustrates a cross-sectional view taken along the line IV-IV' of FIG. 11A according to some example embodiments and the cross-sectional view taken along the line I-I' of FIG. 4 for comparison.

FIG. 14 illustrates the cross-sectional view taken along the line IV-IV' of FIG. 11A and the cross-sectional view taken along the line I-I' of FIG. 4 for comparison, FIGS. 15A and 15B illustrate electric field formation around a second conductive line according to some example embodiments, and FIG. 16 illustrates a cross-sectional view taken along the line IV-IV' of FIG. 11A according to some example embodiments and the cross-sectional view taken along the line I-I' of FIG. 4 for comparison.

The second conductive line 162 may be corroded by an electric field formed in the periphery and moisture permeated from the outside. In particular, the corrosion may be started from an edge of the second conductive line 162 and proceed toward a first contact portion CNT1 along the first direction DR1. When the first contact portion CNT1 is corroded, a contact resistance of the first contact hole CH1 at the first contact portion CNT1 increases and the signal and voltage are not well transmitted, such that display failure may occur.

The corrosion retardation portion CP extends from the first contact portion CNT1, and may increase the time it takes for the corrosion started from the edge of the second conductive line 162 to reach the first contact portion CNT1.

The corrosion retardation portion CP may have an area at least twice as large as an area of the first contact portion CNT1. For example, as illustrated in FIG. 11A, the corrosion retardation portion CP may extend from the first contact portion CNT1 along the first direction DR1.

FIG. 15A shows an electric field formed around the second conductive line 162 when the corrosion retardation portion CP has a length of about 100 μm, and FIG. 15A shows an electric field formed around the second conductive line 162 when the corrosion retardation portion CP has a length of about 150 μm. Referring to the drawings, it may be identified that the electric field formed around the corrosion retardation portion CP has a greater intensity when the length of the corrosion retardation portion CP is about 100 μm than the case where it is about 150 μm. However, in the case where the length of the corrosion retardation portion CP is about 200 μm or more, the electric field saturates and is not reduced any more. Accordingly, the corrosion retardation portion CP may have a length of about 150 μm or more from the first contact portion CNT1.

The third conductive line 163 may be arranged on a layer substantially the same as a layer on which a gate line SL and an emission control line EM are arranged and may include a material substantially the same as a material included in the gate line SL and the emission control line EM. In addition, the third conductive line 163 may be formed unitarily with the gate line SL and the emission control line EM, and accordingly, the third conductive line 163 may be connected to the gate line SL and the emission control line EM. For example, the third conductive line 163 may be arranged on a layer substantially the same as a layer on which the gate line SL which is formed unitarily with a second gate electrode G2 and the emission control line EM which is formed unitarily with a sixth gate electrode G6 are arranged and may include a material substantially the same as a material included in the gate line SL and the emission control line EM. In addition, the third conductive line 163 may be formed unitarily with the gate line SL which is formed unitarily with the second gate electrode G2 and the emission control line EM which is formed unitarily with the sixth gate electrode G6, and accordingly, the third conductive line 163 may be connected to the gate line SL and the emission control line EM which are connected to the gate electrodes G1, G2 and G6.

The third conductive line 163 may be connected to a scan driver 200 at the first area AREA1. Specifically, the first conductive line 163, the second conductive line 162 and the third conductive line 163 may be connected to the scan driver 200 at the first area AREA1, and may be connected to the fanout wiring FO which is connected to a timing controller 100 and a data driver 300 at the second area AREA2.

Referring to FIGS. 14 and 16, at least one of the first conductive line 161 and the second conductive line 162 may be arranged on a layer substantially the same as a layer on which a common power line PL and a data line DL are arranged, and may include a material substantially the same as a material included in the common power line PL and the data line DL. In addition, at least one of the first conductive line 161 and the second conductive line 162 may be formed unitarily with the common power line PL or the data line DL, and accordingly, at least one of the first conductive line 161 and the second conductive line 162 may be connected to the common power line PL or the data line DL.

Although the OLED display devices have been described by way of example in the above example embodiments, the present invention may be applied to other display devices. For example, the present invention may be applied to LCD devices, electrophoretic display devices, and the like.

As set forth hereinabove, in a display device according to one or more example embodiments, a substrate is bended for a terminal to be arranged at a back surface of the substrate at a display area such that the display device may have a narrow bezel. In addition a corrosion retardation portion is arranged at a wiring, such that display quality deterioration due to wiring corrosion may be substantially prevented or reduced.

While aspects of the present invention have been illustrated and described with reference to the example embodiments thereof, it will be apparent to those of ordinary skill in the art that various changes in form and detail may be formed thereto without departing from the spirit and scope of the present invention.

What is claimed is:

1. A display device comprising:
   a substrate having a first area, a second area, and a bending portion between the first area and the second area;
   a first conductive line extending to the first area, the bending portion, and the second area along a first direction on a plane; and
   a second conductive line comprising a first contact portion and a first connection portion, the first contact portion being connected to the first conductive line at the first area and the first connection portion overlapping the first conductive line on a plane and extending along the first direction to the first area, the bending portion, and the second area,
   wherein the second conductive line further comprises a corrosion retardation portion extending from the first contact portion.

2. The display device of claim 1, wherein the corrosion retardation portion has an area at least twice as large as an area of the first contact portion of the second conductive line.

3. The display device of claim 2, wherein the corrosion retardation portion extends along the first direction.

4. The display device of claim 3, wherein the corrosion retardation portion has a length of 150 µm or more in the first direction.

5. The display device of claim 2, wherein the corrosion retardation portion extends along a second direction crossing the first direction.

6. The display device of claim 1, further comprising a pixel at the first area of the substrate,
   wherein the pixel is connected to a data line at the first area, and
   at least one of the first conductive line and the second conductive line is disposed on a same layer substantially the same as a layer on which the data line is disposed.

7. The display device of claim 6, wherein the data line comprises a lower line and an upper line overlapping the lower line,
   the lower line is disposed on a same layer substantially the same as a layer on which the first conductive line is disposed, and
   the upper line is disposed on a same layer substantially the same as a layer on which the second conductive line is disposed.

8. The display device of claim 1, wherein the second conductive line comprises a second contact portion connected to the first conductive line at the second area.

9. The display device of claim 8, further comprising:
   a pixel at the first area of the substrate;
   a data driver and a scan driver configured to supply a signal to the pixel;
   a power supply portion configured to supply a voltage to the pixel; and
   a fanout wiring connected to at least one of the data driver, the scan driver, or the power supply portion.

10. The display device of claim 9, wherein the fanout wiring is formed unitarily with the first conductive line.

11. The display device of claim 9, wherein the fanout wiring is connected to the first conductive line at the second area.

12. The display device of claim 1, further comprising a third conductive line extending along the first direction at the first area,
   wherein the first conductive line comprises a third contact portion contacting the third conductive line at the first area.

13. The display device of claim 12, wherein the corrosion retardation portion has an area at least twice as large as an area of the first contact portion of the second conductive line.

14. The display device of claim 13, wherein the corrosion retardation portion extends along the first direction.

15. The display device of claim 13, wherein the corrosion retardation portion has a length of 150 µm or more in the first direction.

16. The display device of claim 13, wherein the corrosion retardation portion extends along a second direction crossing the first direction.

17. The display device of claim 13, further comprising a pixel at the first area of the substrate,
   wherein the pixel is connected to a gate line at the first area, and
   the third conductive line is disposed on a same layer substantially the same as a layer on which the gate line is disposed.

18. The display device of claim 13, further comprising:
   a pixel at the first area of the substrate;
   a data driver and a scan driver configured to supply a signal to the pixel;
   a power supply portion configured to supply a voltage to the pixel; and
   a fanout wiring connected to at least one of the data driver, the scan driver, and the power supply portion.

19. The display device of claim 18, wherein the fanout wiring is formed unitarily with the first conductive line.

20. The display device of claim 18, wherein the fanout wiring is connected to the first conductive line at the second area.

21. The display device of claim 18, wherein the fanout wiring is connected to the scan driver.

22. The display device of claim 12, further comprising a first insulating layer between the first conductive line and the second conductive line, the first insulating layer having a first contact hole and a second contact hole.

23. The display device of claim 13, further comprising a second insulating layer between the third conductive line and the first conductive line, the second insulating layer having a third contact hole and a fanout contact hole.

24. The display device of claim 23, wherein the second insulating layer is not at the bending portion.

25. A display device comprising:
   a substrate having a first area, a second area, and a bending portion between the first area and the second area;
   a first conductive line extending to the first area, the bending portion, and the second area along a first direction on a plane;
   a second conductive line comprising a first contact portion and a first connection portion, the first contact portion being connected to the first conductive line at the first area and the first connection portion overlapping the first conductive line on a plane and extending along the first direction to the first area, the bending portion, and the second area; and a third conductive line extending along the first direction at the first area, wherein the first conductive line comprises a third contact portion connected to the third conductive line at the first area, the second conductive line further comprises a corrosion retardation portion extending from the first contact portion, and the corrosion retardation portion overlaps the third contact portion.

26. The display device of claim 25, wherein the corrosion retardation portion has an area at least twice as large as an area of the first contact portion of the second conductive line.

27. The display device of claim 26, wherein the corrosion retardation portion extends along the first direction.

28. The display device of claim 27, wherein the corrosion retardation portion has a length of 150 μm or more in the first direction.

29. The display device of claim 26, wherein the corrosion retardation portion extends along a second direction crossing the first direction.

* * * * *